United States Patent
Larson et al.

(10) Patent No.: US 7,160,665 B2
(45) Date of Patent: Jan. 9, 2007

(54) METHOD FOR EMPLOYING VERTICAL ACID TRANSPORT FOR LITHOGRAPHIC IMAGING APPLICATIONS

(75) Inventors: Carl Eric Larson, San Jose, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/334,219

(22) Filed: Dec. 30, 2002

(65) Prior Publication Data

US 2004/0126715 A1 Jul. 1, 2004

(51) Int. Cl.
*G03F 7/38* (2006.01)
*G03F 7/095* (2006.01)

(52) U.S. Cl. .................. 430/202; 430/203; 430/271.1; 430/273.1

(58) Field of Classification Search ................ 430/202, 430/203; G03F 7/095
See application file for complete search history.

(56) References Cited

U.S. PATENT DOCUMENTS

| | | | | |
|---|---|---|---|---|
| 3,779,778 A | * | 12/1973 | Smith et al. | 430/270.1 |
| 4,545,851 A | * | 10/1985 | Takada | 438/640 |
| 5,350,485 A | * | 9/1994 | Shiraishi et al. | 216/13 |
| 5,759,748 A | * | 6/1998 | Chun et al. | 430/323 |
| 5,858,620 A | * | 1/1999 | Ishibashi et al. | 430/313 |
| 5,939,236 A | | 8/1999 | Pavechek et al. | |
| 5,985,524 A | | 11/1999 | Allen et al. | |
| 6,156,480 A | * | 12/2000 | Lyons | 430/312 |
| 6,258,514 B1 | | 7/2001 | Montgomery | |
| 6,306,555 B1 | * | 10/2001 | Schulz et al. | 430/270.1 |
| 6,319,650 B1 | | 11/2001 | Gelorme et al. | |
| 6,359,078 B1 | | 3/2002 | Boardman et al. | |
| 2001/0003030 A1 | | 6/2001 | Jung et al. | |
| 2002/0055065 A1 | | 5/2002 | Boardman et al. | |
| 2002/0058198 A1 | * | 5/2002 | Klauck-Jacobs et al. | 430/270.1 |
| 2002/0058199 A1 | * | 5/2002 | Zampini et al. | 430/270.1 |

FOREIGN PATENT DOCUMENTS

| | | | |
|---|---|---|---|
| EP | 0 690 111 A1 * | 1/1996 | |
| EP | 0 905 565 A1 * | 3/1999 | |
| JP | 07-86127 A * | 3/1995 | |
| JP | 11-231544 A * | 8/1999 | |

OTHER PUBLICATIONS

Hinsberg et al , "Lithographic Resists" from Encyclopedia of Polymer Science and Technology, John Wiley & Sons, Inc., Article Online Posting Date; Jul. 15, 2002, pp. 1of1, 4 of4, 11 of 11, 3 of 3, 9 of 9, Figures 10, 18, 19, 5 of 5.*

Hinsbert et al, Lithographic Resists ; sections 3 and 4, Kirk-Othmer Encyclopedia of Chemical Technology, John Wiley & Sons Inc, 1998, Article online posting date Dec. 4, 2000, pp. 16 of 16 and 5 of 5.*

(Continued)

*Primary Examiner*—Cynthia Hamilton
(74) *Attorney, Agent, or Firm*—Scully, Scott, Murphy & Presser; Daniel E. Johnson (57) ABSTRACT

The present invention provides methods for forming images in positive- or negative-tone chemically amplified photoresists. The methods of the present invention rely on the vertical up-diffusion of photoacid generated by patternwise imaging of an underlayer disposed on a substrate and overcoated with a polymer containing acid labile functionality. In accordance with the present invention, the vertical up-diffusion can be the sole mechanism for imaging formation or the methods of the present invention can be used in conjunction with conventional imaging processes.

5 Claims, 5 Drawing Sheets

OTHER PUBLICATIONS

Oki Electric IND, Patent Abstracts of Japan Publication No. 11-231544 and attached Machine generated English translation, date of publication Aug. 1999.*

Derwent-ACC- 1999-533125, Copyright 1999, Derwent Information LTD, English abstract of JP 11231544, 2 pages.*

Toshiba Corp, Publication No: 07-086127, published Mar. 31, 1995, abstract and machine translation from JPO web site.*

AN 1995:610679, English ABstract of JP 07086127 A2, Entered Stn Jun. 15, 1995, CAplus ACS on STN one page.*

Derwent -Acc-No: 1999-206847, copyright 2006, Dwerment Invormation LTD, 4 pages.*

Machine -Assisted Translation from The Thomson Corporation done Dec. 5, 2005 of JP 07-86127 A, 25 pages.*

Michael D. Stewart, et al. (2000) "Study of Acid Transport IR Spectroscopy and SEM", Proceedings of SPIE, vol. 3999, pp. 665-674, no month given.

Kirk-Othemer Encyclopedia of Chemical Technology, Fourth Edition, Supplement ISBN 0-71-52696-7, "Lithographic Resists", pp. 233-280, copyright 1998.

G. M. Wallraff, et al. (1999) "Experimental Method For Quantifying Acid Diffusion in Chemically Amplified Resists", Proc. SPIE, vol. 3678, pp. 138-148; and, no month given.

E. Reichmanis, et al. (1991) "Chemical Amplification Mechanisms for Microlithography", Chem. Mater., vol. 3, No. 3, pp. 394-407, no month given.

* cited by examiner

METHOD FOR EMPLOYING VERTICAL ACID TRANSPORT FOR LITHOGRAPHIC IMAGING APPLICATIONS

FIELD OF THE INVENTION

The present invention relates to lithography, and more particularly to methods for substantially minimizing the deleterious effects of high absorbance (low transparency) in photoresist films employed in deep ultraviolet (DUV) and extreme ultraviolet (EUV) lithographic imaging. More specifically, the present invention relates to the application of vertical up-diffusion of photoacids generated in underlayers to improve imaging performance and resist profiles in semi-transparent chemically amplified resists.

BACKGROUND OF THE INVENTION

In the semiconductor industry, there is a desire for higher circuit density in microelectronic devices made using lithographic techniques. Historically, this has been largely accomplished through a combination of wavelength scaling (decreasing the wavelength of the imaging radiation), improvements in the imaging optics (employing lenses with higher numerical apertures), and the use of higher performance photoresists optimized for each new wavelength. The goal is to generate ever-smaller photoresist features with the proper attributes (i.e., vertical shape, etch resistance, etc.), which can then serve as relief images that enable the accurate transfer of a photoimage to the underlying substrate. It is also a requirement that photoresists for 157 nm and EUV lithography function at low exposure doses (have high photospeeds) due to issues of tool throughput and source intensity considerations.

As the semiconductor industry (currently at 248 nm and 193 nm generations) moves to 157 nm and 13.4 nm technology, resist transparency becomes a serious issue. The 157 nm resists currently under development are based on fluorinated polymers with absorbances of 1 to 3 $\mu m^{-1}$. Current generation EUV resists (based on phenolic polymers) have values of approximately 2 $\mu m^{-1}$. These values are much higher than found in formulated DUV resists (with absorbances of approximately 0.2 to 0.4 $micron^{-1}$) and pose significant problems for pattern profile control even in the 1000 to 3000 Å thick films required for imaging sub-100 nm features. For example, a change in film transparency from 65% (absorbance of 0.19) to 20% (absorbance of 0.7) has a very large impact on the feature profiles and results in features that have sloping sidewalls and incomplete development to the surface of the substrate. Degraded resist profiles of this type cannot be used in pattern transfer applications.

While major research activities are underway to improve resist transparency at short wavelengths, particularly at 157 nm, it is unlikely that even the best short wavelength resists will be able to achieve the combination of transparency and etch resistance enjoyed by current 193 and 248 nm resists.

There are a number of approaches in the prior art that can potentially be used to address the problem of poor resist profiles. These prior art approaches include multi layer resist systems (also known as thin film imaging resists) employing silicon based polymers or precursors (Willson, C. G. In Introduction to Microlithography 2nd Ed.; ACS Professional Reference book, American Chemical Society, Washington DC.; 1994, Chapter 3; and Miller, R. D., Wallraff, G. M. in Advanced Materials for Optics and Electronics, 1994, 4, 95) can be used to circumvent problems due to highly absorbing resists since image formation occurs in a thin film (in the case of a bilayer resist see U.S. Pat. No. 5,985,524 to Allen, et al.) or in the top surface of the resist. This image is then transferred to the underlying polymer via an anisotropic etch to yield patterns with vertical walls throughout the polymer film(s). As such, this two stage process (imaging followed by $O_2$ anisotropic etch) is fundamentally different from the standard single layer resist process in which the resist relief profile is generated within a single polymer film.

Single layer resists are often used in conjunction with additional polymer films (disposed on top or beneath the imaging layer) to improve image profiles. The primary use of these films is to circumvent problems which are not due to high absorbance but rather due to low resist absorbance. These anti-reflection coatings (ARC's) (Levinson, H., Arnold, W. In Handbook of Microlithography, Micromachining, and Microfabrication, Rai-Choudhury Ed., SPIE Optical Engineering Press: Bellingham, Washington, 1997, 1, Chapter 1) are designed to minimize reflective notching, standing waves and other consequences due to reflectivity at the resist substrate interface. The presence of a bottom ARC (the most prevalent type of reflectivity control system) can unfortunately introduce a different type of profile degradation not linked to resist transparency but rather due to deleterious interaction between the ARC and the chemically amplified photoresist. This interaction (sometimes termed as resist "poisoning") can result as a thin insoluble resist skin or "foot" at the base of the developed photoresist image (positive tone resist). This effect can be minimized through the incorporation of additives such as acids or photoacid generators. These materials are selected so as to have low diffusivity and thus provide little or no contribution to image formation within the transparent resist film (see U.S. Pat. No. 5,939,236 to Pavelchek et al.).

Alternatively overcoated films containing diffusive basic additives have been disclosed (see Jung et al., application 20010003030) to improve the image profiles in highly absorbing films by neutralizing photoacid at the top of the resist and thus creating a more uniform photoacid concentration throughout the resist film. In this case, the top of the resist film is deliberately "poisoned" requiring that the resist be overexposed (exposed at a higher imaging dose) to achieve vertical profiles. This is an application of the well known consequences of environmental contamination on photoresist profiles (see Hinsberg, W. D., Wallraff, G. M., Allen, R. D. in Kirk-Othmer Encyclopedia of Science and Technology Fourth Edition Supplement 1998).

None of the above mentioned approaches addressees the problem of poor resist profiles in high photospeed semi-transparent resists. It is therefore an object of the present invention to provide an improved process for use in the imaging of semi-transparent resist materials.

SUMMARY OF THE INVENTION

The present invention provides methods for forming images in positive- or negative-tone chemically amplified photoresists. The methods of the present invention rely on the vertical up-diffusion of photoacid generated by pattern-wise imaging of an underlayer disposed on a substrate and overcoated with a polymer containing acid labile functionality. In accordance with the present invention, the vertical up-diffusion can be the sole mechanism for imaging formation or the methods of the present invention can be used in conjunction with conventional imaging processes.

The extent of the vertical up-diffusion into the overlying photoresist layer is dependent on the thickness of the photoresist layer. Typically, the extent of upward acid migration into the overlying layer will substantially extend beyond the resist: underlayer interface. Due to this acid migration, the acid content present at the bottom portion of the overlying layer is preferably substantially equal to the content of acid present in the upper portion of the overlying layer.

More specifically, the present invention relates to methods for generating an image in a bilayer film disposed on a substrate. A preferred embodiment of the present invention comprises (A) an underlayer comprising (i) a photoacid generator and (ii) a polymeric material that includes at least one of an organic polymer and an inorganic matrix material, wherein said photoacid generator is selected to enhance vertical transport of generated acid into an overlying layer; and (B) a layer overlying said underlayer that comprises an organic polymer containing acid reactive groups suitable for use in chemically amplified photoresists.

In broad terms, a preferred lithographic method of the present invention includes:

depositing an underlayer on a surface of a substrate, said underlayer comprising (i) a photoacid generator and (ii) a polymeric material that includes at least one of an organic polymer and an inorganic matrix material;

irradiating the underlayer to generate acid throughout a patterned region in the underlayer; and transferring the pattern formed in the underlayer to a layer overlying the underlayer, said transferring comprising vertically transporting acid from the underlayer to the overlying layer to substantially enhance the density of acid throughout the overlying layer, wherein sufficient acid is present in the overlying layer to permit lithographic pattering of the overlying layer, and wherein the photoacid generator is selected to enhance said vertically transporting.

In accordance with the present invention, which may be advantageously used with conventional imaging systems, the density of acid at the bottom of the resist film in the overlying layer prior to acid transference is less than that accumulated in the top portions of the resist film and generally below the threshold required for resist development. After acid migration, the density of acid is present more continuously from the top of the film to the bottom of the film.

The one or more radiation sensitive acid generators present in the underlayer composition of the present invention are referred to herein as a photoacid generator (i.e., PAG). The acid reactive groups present in component (B) may comprise moieties such as esters, carbonates or ketals which upon reaction with a generated acid are converted to components that are soluble in photoresist developers. Resists based on such functionality are termed "positive-tone". Other acid reactive groups which may be present in component (B) are capable of undergoing processes such as crosslinking reactions which render such films less soluble to photoresist developers and are termed "negative-tone" systems.

The present invention is designed to ameliorate the problems encountered when imaging photoresist films of marginal transparency. Conventional semiconductor lithography is based on the generation of a photochemical image of acid within the reactive polymer film and in the case of absorbing resist films the bottom of the film receives significantly less light than does the top of the resist film. As a consequence, less photoacid is produced resulting in diminished reaction at the bottom of the resist film. By incorporating the inventive underlayer beneath a conventional photoresist, (e.g., the overlying layer) reaction may, in some embodiments, be achieved throughout the resist film. Other embodiments are possible including a process in which the only source of photoacid is that produced in the inventive underlayer and the resist profile is substantially determined by the acid catalyzed reaction resulting from the vertical up-diffusion of acid generated in the imagewise exposed underlayer. In a yet further embodiment of the present invention, the process relies on overcoating the acid liable polymer on an imagewise exposed underlayer subsequent to exposure. In this case, the transparency of the polymer topcoat is not an issue.

BRIEF DESCRIPTION OF THE DRAWINGS

FIGS. 4A–4B are scanning electron micrographs (SEMs) comparing the 157 imaging using prototype 157 nm aromatic resist, in which FIG. 4A is representative of the present invention (see Example 1) and FIG. 4B is a comparative example (see Comparative Example 1).

DETAILED DESCRIPTION OF THE INVENTION

The present invention, which provides a photoactive underlayer for imaging photoresist films, particularly semi-transparent photoresist films, will now be described in greater detail.

The photoactive underlayer of the present invention comprises one or more photoacid generators (PAGs) and at least one of an organic polymer and an inorganic matrix material. The PAG component of the inventive underlayer is employed in amounts sufficient to generate a photoacid(s) concentration that is sufficient to effect acid catalyzed reactions over a significant depth of the overlying layer. Suitable amounts of the PAGs present in the underlayer of the present invention range from about 0.5 to about 20 weight percent, based on the total weight of the underlayer. More preferably, the PAG is present in the underlying composition in an amount of from about 0.5 to about 7.5 weight percent, based on the total weight of the underlayer. Particularly preferred amounts of the one or more PAGs will be a function of quantum yield, relative diffusivity, and acid strength, e.g., $pK_a$, of the photoacids generated.

In addition, the selection of the PAG for use in the underlayer of the present invention is a function of the desired acid migration depth into the overlying layer. This will be a function of the thickness of the overlying layer, or a function of the extent of reaction due to conventional imaging. In the latter case, it is desired that the photoacid generated in the underlayer have substantially different properties than the photoacid generated in the overlying layer by conventional exposure. More specifically, the PAG in the underlayer should generate a photoacid of higher diffusivity, preferably with equal or lower acidity than that employed in the overlying layer. PAGs used in conventional DUV photoresists are generally selected for their low diffusivity to minimize image blur; photoacid generators used in the underlayer of the present invention require higher diffusion coefficients that are tailored to the specific polymer in use.

Suitable acid generators that may be present in the underlayer include triflates (e.g., triphenylsulfonium triflate or bis-(t-butylphenyl) iodonium triflate), pyrogallol (e.g., trimesylate or pyrogallol), onium salts such as a triarylsulfonium and diaryl iodonium hexafluoroantimates, hexafluoroarsenates, trifluoromethane sulfonates and others; iodonium sulfonates and trifluoromethanesulfonate esters of hydroxyamines, alpha'-bis-sulfonyl diazomethanes, sulfonate esters of nitro-substituted benzyl alcohols and napthoquinone-4-diazides and alkyl disulfonates. Other suitable acid generators for use in the underlayer are disclosed, for example, in U.S. Pat. Nos. 5,045,431 and 5,071,730 both to Allen, et al. and Reichmanis, et al. review article (Chemistry of Materials, Vol. 3, page 395 (1991), the disclosures of which are incorporated herein by reference.

Preferred PAGs for use in the underlayer of the present invention include, but are not limited to: onium salts (iodonium and sulfonium) of perfluoroalkyl sulfonates, methides and imides, and other sulfonate esters. Mixtures of such PAGs are also contemplated to be present in the underlayer of the present invention. Highly preferred PAGs for the underlayer of the present invention are triarylsulfonium and diaryl iodonium imides. (W. M. Lamanna, et al. included by reference. PROC SPIE 4690 817 2002).

Other suitable PAGs that can be used in the underlayer composition of the present invention are disclosed in E. Reichmanis, et al., Chem. Mater, 1991, 3, 394; W. D. Hinsberg, et al. in Kirk Othmer Encyclopedia of Science Technology, Fourth Edition Supplement 1998, the disclosures of which are both incorporated herein by reference.

The $pK_a$ values of the acids generated in the underlayer are preferably equal to or less than the $pK_a$ values of the acids generated in the overlying layer.

In addition to the one or more PAGs, the underlayer of the present invention also includes at least one of an organic polymer and an inorganic matrix material that preferably have absorbances less than or equal to 12 micron$^{-1}$. The organic polymer or inorganic matrix material component of the underlayer of the present invention preferably do not appreciably dissolve or intermix with the polymer topcoat during the top processing steps of coating and post apply bake. Suitable organic polymers present in the underlayer of the present invention include: hard baked diazonapthoquinone (DNQ) novolac, polyimides, polyethers, polyacrylates and other organic polymers that are crosslinkable. Suitable inorganic matrix materials for use in the underlayer of the present invention include inorganic and/or hybrid organic/inorganic polymers such as spin on silsesquioxanes (linear, branched or caged), hydridosilsesquioxoane, methylsilsesquioxoane and other Si-containing polymers; commercial bottom anti-reflective coatings (ARCs) can also be used.

The underlayer of the present invention is generally cast from an organic solvent. Suitable solvents for the underlayer include, but are not limited to: propylene glycol mether ether acetate, cyclohexanone and ethyl lactate.

The overlying layer of the bilayer film of the present invention includes any photoresist including positive-tone photoresists and negative-tone photoresists that are capable of undergoing a chemically amplified reaction. Specifically, the chemically amplified photoresists employed in the present invention include at least a polymer resin. Generally, the polymer resins employed in the overlying layer are homopolymers or higher polymers containing two or more repeating units and a polymeric backbone. The polymer resins present in the overlying layer typically contain polar functional groups such as hydroxyl.

Illustrative examples of suitable homopolymers that can be utilized in the present invention include, but are not limited to: phenolic-containing resins such as poly(hydroxystyrene) including the meta-, para- or ortho substituted forms, and phenol formaldehydes; polymers having acid or an anhydride group, e.g., polyacrylic acid or polymethacrylic acid; acrylamide; imide or hydroxyimides. Such polymers typically have an average molecular weight of from about 1000 to about 250,000.

With respect to the polymer resins that contain at least two monomer units, the monomer units employed in such higher polymers are selected from the group of hydroxystyrenes, styrenes, acrylates, acrylic acid, methacrylic acid, vinylcyclohexanol, phenol formaldehydes, methacrylates, acrylamides, maleic anhydrides and maleimides.

The polymer resins of the overlying layer may also contain a polymeric backbone such as, for example, polyolefins, polyolefin sulfones, polysulfones, polycyclic olefins, polycarbonates, polyimides, polyketones, polyethers and the like.

In some embodiments of the present invention, the polymer resin is an aromatic fluoroalcohol or other like fluorinated polymers which are suitably used as 157 nm photoresists. Aromatic fluoroalcohols that may be employed in the present invention are described, for example, in Wallraff, et al. Proc. SPIE 1999, 3678, 138, the entire content of which is incorporated herein by reference.

The polymer resins of the overlying layer also include acid reactive functional groups that are capable of undergoing a chemically amplified reaction upon exposure to radiation. These active groups are typically used to protect the polar groups of the polymer resin and are deprotected therefrom during the imaging process. Depending on the type of the acid reactive functional groups present in the polymer resin, the overlying layer may function as a positive-tone chemically amplified resist or a negative-tone chemically amplified resist. When a positive-tone chemically amplified resist is employed as the overlying layer, the acid reactive functional groups that may be present on the polymer resin include esters, carbonates, ketals, acetals, silyl ethers or mixtures thereof. Such acid reactive groups react with acid generated upon exposure to radiation providing components that are soluble in photoresist developers. The aforementioned acid reactive groups are well known to those skilled in the art; therefore a detailed description of the same is not need herein.

When the polymer resin is a negative-tone photoresist, the acid reactive groups include reactive moieties such as alcohols that are capable of undergoing a crosslinking reaction. The crosslinking reaction renders the polymer resin less soluble in a photoresist developer.

The fundamental processes and compositions used in chemically amplified photoresists are well known to those skilled in the art and are described, for example, in E. Reichmanis, et al., Chem. Mater, 1991, 3, 394; W. D. Hinsberg, et al. in Kirk Othmer Encyclopedia of Science Technology, Fourth Edition Supplement 1998, the disclosures of which are both incorporated herein by reference.

In addition to the polymer resins which contain the acid reactive functional groups, the overlying layer may also include an acid generator and/or a crosslinking agent. The acid generators are typically found in positive-tone photoresists, while the negative-tone photoresists typically incorporate crosslinking agents in addition to photoacid generators.

Other minor components that may be present in the overlying layer include bases, surfactants, dissolution inhibitors, sensitizers, coating enhancers and other compounds known to those skilled in the art.

Suitable acid generators that may be present in the overlying layer include triflates (e.g., triphenylsulfonium triflate or bis-(t-butylphenyl) iodonium triflate), pyrogallol (e.g., trimesylate or pyrogallol), onium salts such as a triarylsulfonium and diaryl iodonium hexafluoroantimates, hexafluoroarsenates, trifluoromethane sulfonates and others; iodonium sulfonates and trifluoromethanesulfonate esters of hydroxyamines, alpha'-bis-sulfonyl diazomethanes, sulfonate esters of nitro-substituted benzyl alcohols and napthoquinone-4-diazides and alkyl disulfonates. Other suitable acid generators for use in the overlying layer are disclosed, for example, in U.S. Pat. Nos. 5,045,431 and 5,071,730 both to Allen, et al. and Reichmanis, et al. review article (Chemistry of Materials, Vol. 3, page 395 (1991), the disclosures of which are incorporated herein by reference.

The overlying photoresist composition employed in the present invention may also include any suitable crosslinking agent known in the negative photoresist art which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethylglycoluril, available under the POWDERLINK trademark from American Cyanamid Company. Other possible crosslinking agents include: 2,6-bis(hydroxymethyl)-p-cresol, compounds having the following structures:

wherein $R_{13}$ is $CH_3$ or $CH_2CH_3$; and $R_{14}$ and $R_{15}$ are each independently a $C_1$–$C_8$ alkyl or aryl hydrocarbon;

-continued including their analogs and derivatives, such as those found in Japanese Laid-Open Patent Application (Kokai) No. 1-29339, as well as etherified amino resins, for example methylated or buylated melamine resins (N-methoxymethyl- or N-butoxymethyl-melamine respectively) or methylated/butylated glycolurils, for example as can be found in Canadian Patent No. 1 204 547. Combinations of crosslinking agents may also be used.

In addition to the above components, the overlying photoresist compositions of the present invention generally include a casting solvent to dissolve the other components so that the overall composition may be applied evenly onto the surface of the underlayer to provide a defect-free coating. The solvent used in the overlying photoresist layer preferably does not appreciably dissolve the materials present in the underlayer, since otherwise unwanted intermixing may occur. Examples of suitable casting solvents include: ethoxyethylpropionate ("EEP"), a combination of EEP and γ-butyrolactone ("GBL"), propylene-glycolmonoethylether acetate (PGMEA), and ethyl lactate. The present invention is not limited to selection of any particular solvent.

Examples of bases include: dimethylamino pyridine, 7-diethylamino-4-methyl coumarin ("Coumarin 1"), tertiary amines, proton sponge, berberine, and the polymeric amines as in the PLURONIC or TETRONIC series from BASF. Tetra alkyl ammonium hydroxides or cetyltrimethyl ammonium hydroxide may be used as a base additive, as well.

Examples of possible surfactants include fluorine-containing surfactants such as FLUORAD FC-430 available from 3M Company in St. Paul, Minn., and siloxane-containing surfactants such as the SIL WET series available from Union Carbide Corporation in Danbury, Conn.

Examples of sensitizers include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605. The sensitizer may include oxygen or sulfur. The preferred sensitizers will be nitrogen free, because the presence of nitrogen (e.g., an amine or phenothiazine group) tends to sequester the free acid generated during the exposure process resulting in loss of photosensitivity.

The overlying photoresist compositions of the present invention are not limited to any specific proportions of the various components. Where the overlying photoresist compositions of the present invention contain a solvent, the compositions preferably contain about 5 to 50 wt. % solids. The amount of acid generator present in the overlying layer is preferably about 1 to 20 wt. % based on the weight of the polymer component. The amount of crosslinking agent present in the overlying layer is preferably about 1 to 30 wt. % based on the weight of the polymer component, more preferably about 5 to 25 wt. %.

The above description describes the various components of the underlayer and overlying photoresist layer of the bilayer film of the present invention. The following description, with reference to FIGS. 1A–1D, 2A–2E, and 3A–3D, describes various methods of the present invention. In the drawings, identical reference numerals are used to describe like materials.

FIGS. 1A–1D illustrate one embodiment of the present invention in which the overlying photoresist layer is applied to the underlayer prior to imagewise exposure to radiation. Also, in the illustrated example, the top overcoated photoresist layer need not contain a PAG. The only source of acid illustrated in this example may be in the underlayer.

Figure 1A:
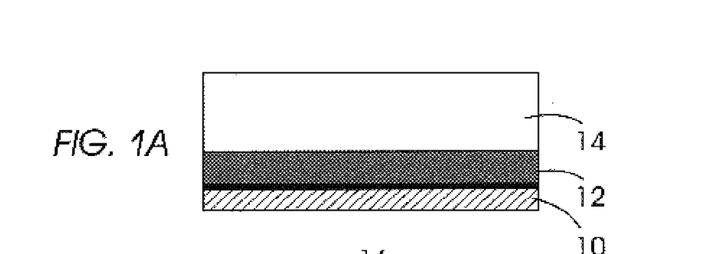
FIGS. 1A–1D are pictorial representations (through cross-sectional views) illustrating the method of the present invention through a first processing scheme.

Specifically, FIG. 1A shows a structure that is formed after applying underlayer 12 to a surface of substrate 10 and after applying overlying layer 14 to a surface of underlayer 12. The compounds of the underlayer are typically admixed prior to the application thereof to substrate 10. The substrate may be any semiconductor substrate, any conductive material, any insulating material or combinations thereof, including multilayers.

Examples of semiconductor materials include, but are not limited to: Si, SiGe, SiC, SiGeC, GaAs, InAs, InP and other III/V compound semiconductors. The term "semiconducting" also includes silicon-on-insulators. Examples of conductive materials include, but are not limited to: polysilicon, metals, metal alloys, and metal silicides. Illustrative examples of insulating materials include, but are not limited to: oxides, nitrides and oxynitrides.

The substrate may be cleaned by standard processes well known to those skilled in the art prior to applying the underlayer 12 to the surface of substrate 10. The underlayer may be coated onto the substrate using art-known techniques such as spin-on coating, spray coating, brushing, dip coating or by a doctor blade. After application of the underlayer, the underlayer is typically heated to an elevated temperature of about 100° to about 250° C. for a short period of time of from about 1 to about 30 minutes to drive off solvent and optionally induce thermal crosslinking of the underlayer. The dried underlayer generally has a thickness of from about 0.01 to about 1 micron, with a thickness of from about 0.03 to 1 micron being more highly preferred.

The overlying layer is then applied to the underlayer using one of the above mentioned coating processes. A heating step may also follow the application of the overlying layer. When a heating step is employed at this point, the heating is performed at an elevated temperature of about 100° to about 150° C. for a short period of time of from about 1 to about 30 minutes to drive off solvent present in the overlying layer. The final overlying layer after coating and heating has a thickness of from about 0.1 to about 10 microns, with a thickness of from about 0.1 to about 1 microns being more highly preferred.

Next, the film shown in FIG. 1A is imagewise exposed to radiation, suitably electromagnetic radiation or electron beam radiation, preferably ultraviolet radiation suitably at a wavelength of about 150–365 nm, preferably 157 nm, 193 or 248 nm. In some embodiments, EUV radiation (13 nm) may be employed. Suitable radiation sources include mercury, mercury/xenon, xenon lamps, excimer lasers and soft x-ray sources. The preferred radiation source is an ArF excimer laser, a KrF excimer laser or a $F_2$ laser.

Figure 1B:
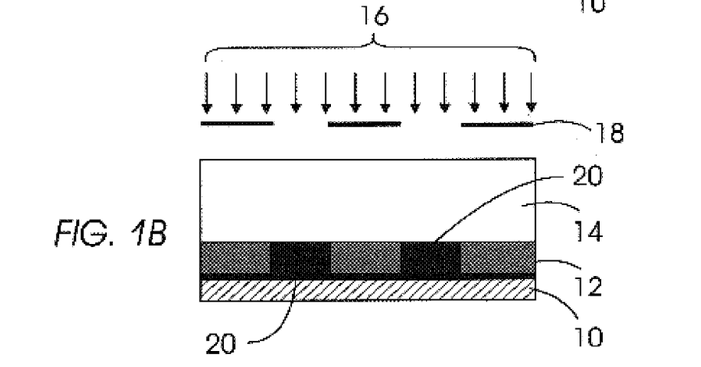

FIG. 1B illustrates the structure during the imagewise exposure step. As shown, the arrows designated by reference numeral 16 represent the applied radiation, reference numeral 18 denotes a photomask that is used to provide a desired pattern in the bilayer film of the present invention, and reference numeral 20 denotes the latent photoacid image formed in underlayer 12 during the exposure step. That is, region 20 denotes the area in which the acid is generated in the underlayer.

Figure 1C:
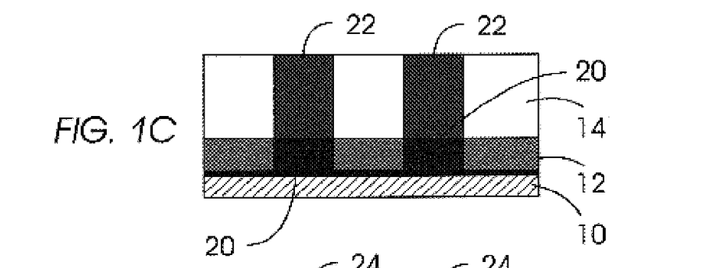

After the bilayer film has been exposed to radiation, the film is heated to an elevated temperature of from about 90° to about 160° C. for a short period of about 1 minute or less. This heating step of the present invention causes a chemical transformation in the overlying layer, e.g., deprotection, and diffusion of photoacid from the underlying layer into the overlying layer. The resultant structure that is formed after the heating step is illustrated in FIG. 1C. In this figure, reference numeral 22 denotes the area of vertical up-diffusion of PAG that is generated in the bilayer film of the present invention. As shown, the photoacid is present in the imagewise exposed portions essentially continuously from the top surface of the overlying layer down to the interface that is formed between the underlayer and the overlying layer.

Figure 1D:
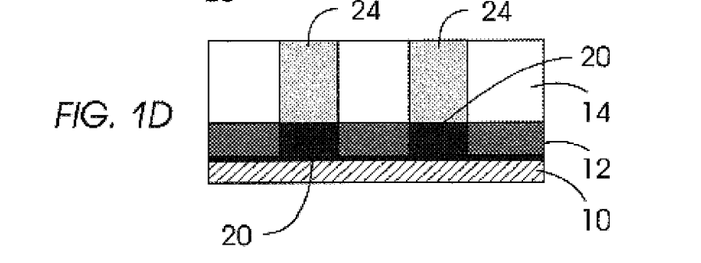

FIG. 1D shows the step of developing the image into the overlying layer by utilizing a conventional resist developer. Reference numeral 24 denotes the patterned image formed into the overlying layer. Suitable resist developers for developing a high contrast positive image include an aqueous base, preferably an aqueous base without metal ions such as tetramethylammonium hydroxide or choline. As shown in this example, the development results in the removal of the exposed areas of the overlying film.

In other embodiments (not shown), the unexposed portions of the overlying layer is removed utilizing a developer solution that is capable of removing the unexposed regions from the overlying layer.

After providing the structure shown in FIG. 1D, the developed image is transferred through the underlayer into the substrate by known techniques. Preferably, the image is transferred by etching with reactive ions such as plasma etching and reactive ion etching. Suitable plasma tools include electron cyclotron resonance (ECR), helicon, inductively coupled plasma (ICP) and transmission coupled-plasma (TCP) systems. Suitably, oxygen reactive ion etching (magnetically induced) is utilized to transfer the image through the underlying layer. Etching techniques and equipment are well known in the art. The developed film has high aspect ratio, enhanced resolution, and substantially vertical wall profiles.

The bilayer film of the present invention may be used to make an integrated chip assembly such as an integrated circuit chip, multichip module, circuit board, or thin film magnetic heads.

Figure 2A:
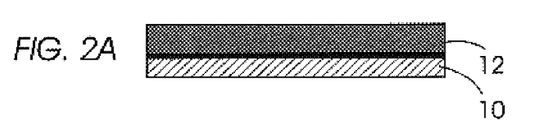
FIGS. 2A–2E are pictorial representations (through cross-sectional views) illustrating the method of the present invention through a second processing scheme.
Figure 2B:
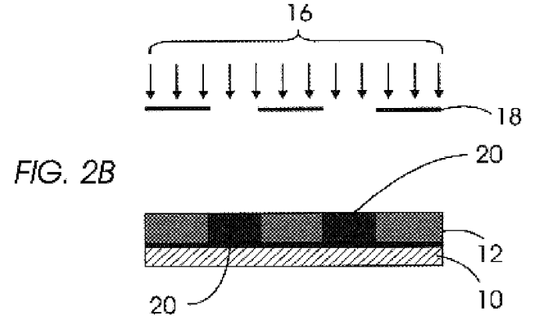
Figure 2C:
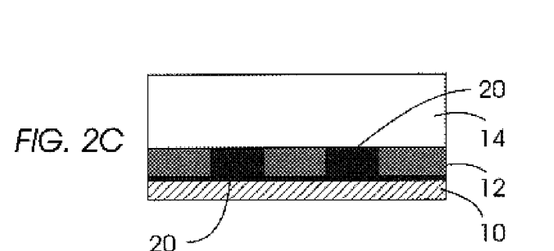

FIGS. 2A–2E illustrates another embodiment of the present invention. In this embodiment, the underlayer is imagewise exposed prior to application of the overlying photoresist layer. Specifically, FIG. 2A illustrates a structure which includes underlayer 12 applied to a surface of substrate 10. Next, and as shown in FIG. 2B, the structure shown in FIG. 2A is imagewise exposed to a pattern of radiation. As shown, the arrows designated by reference numeral 16 represent the applied radiation, reference numeral 18 denotes a photomask that is used to provide a desired pattern in the structure, and reference numeral 20 denotes the latent photoacid image formed in underlayer 12 during the exposure step. Note that acid is generated in the underlayer during this step of the present invention.

Figure 2D:
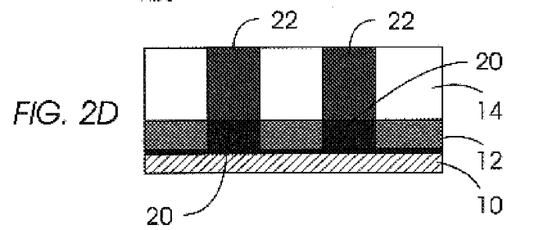
Figure 2E:
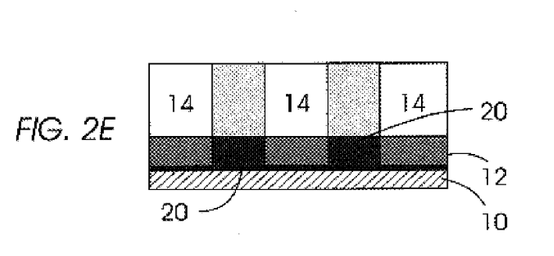

After exposing the structure to radiation, overlying layer 14 is applied to the underlayer containing latent photoacid image 20 (see FIG. 2C), and then the structure is heated as described above with respect to the first embodiment to cause acid up-diffusion and deprotection of the polymer resin in the overlying photoresist composition (see FIG. 2D). In FIG. 2D, reference numeral 22 denotes the area of vertical up-diffusion of photoacid that is generated in the bilayer film. As shown, the generated acid is present essentially continuously from the top surface of the overlying layer down to the interface between the underlayer and the overlying layer.

The imagewise pattern may then be transferred through the underlayer into the substrate using the techniques described above.

FIGS. 3A–3D shows a further embodiment of the present invention. This embodiment is similar to the embodiment shown in FIGS. 1A–1D except that the overlying layer includes a PAG material itself. In this embodiment, the PAG material present in the overlying layer is different from the PAG present in the underlayer. In particular, the PAG present in the underlayer generates an acid that has a higher diffusivity than the acid generated by the PAG in the overlying layer. Moreover, the acid generated in the underlayer should generally have an equal or less acidity than that generated in the overlying layer.

Figure 3A:
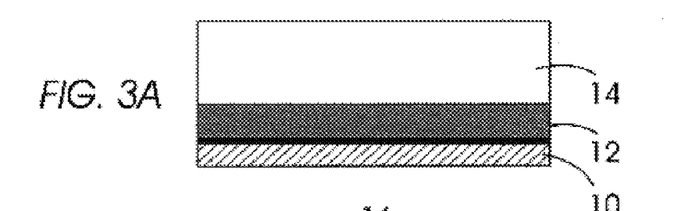
FIGS. 3A–3D are pictorial representations (through cross-sectional views) illustrating the method of the present invention through a third processing scheme.

FIG. 3A illustrates the structure that is formed after the inventive bilayer is applied to a surface of substrate 10. The bilayer includes underlayer 12 and overlying photoresist layer 14 which includes a photoacid generator.

Figure 3B:
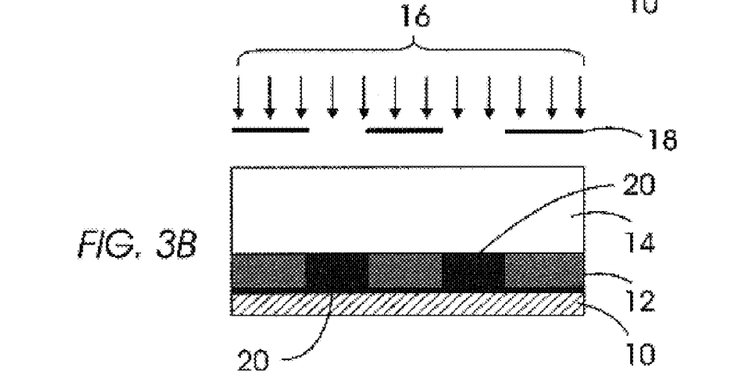

FIG. 3B shows the structure during imagewise exposure. As shown, the arrows designated by reference numeral 16 represent the applied radiation, reference numeral 18 denotes a photomask that is used to provide a desired pattern in the bilayer film of the present invention, and reference numerals 20 and 21 denote the latent photoacid image formed in underlayer 12 and overlying layer 14, respectively, during the exposure step. Note that acid is generated in both layers of the bilayer film during this step.

Figure 3C:
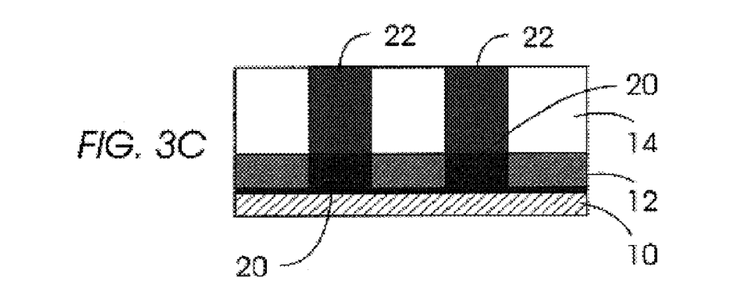
Figure 3D:
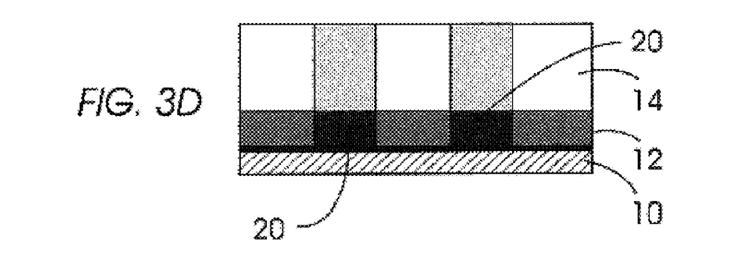

Next, the structure is heated as described above in the first embodiment to cause acid up-diffusion and deprotection of the polymer resin in the overlying photoresist composition (see FIG. 3C). In FIG. 3C, reference numeral 22 denotes the area of vertical up-diffusion of photoacid that is generated in the bilayer film of the present invention. As shown, the generated acid is present essentially continuously from the top surface of the overlying layer down to the interface between the underlayer and the overlying layer. FIG. 3D shows the resultant structure after developing the pattern into the overlying photoresist layer.

The imagewise pattern may then be transferred through the underlayer into the substrate using the techniques described above.

In each of the above described embodiments, thermally driven vertical acid transportation is occurring. Previous studies on top surface imaged resist systems have shown that the extent of vertical photoacid diffusion varies over a wide range and is a strong function of the specific polymer:PAG combinations (see G. Wallraff, et al., Proc. SPIE 1999, 3678, 138). The thickness and transparency of the film to be patterned will dictate the properties of the PAG employed in the underlayer of the present invention. Resolution can be controlled in the present invention to some extent by controlling the thickness of the overlying layer and/or through the incorporation of bases or other additives.

In the second embodiment of the present invention mentioned above, the absorbance of the overlying photoresist layer is not an issue since imaging occurs prior to coating of the overcoat layer. Thus, an opaque polymer resin may be employed. The absence of a PAG in the polymer resin of the overcoat layer in the first embodiment described above also contributes to transparency. In the case of a highly absorptive overcoat photoresist such as the case in the third embodiment described above, the presence of a mobile photoacid generated in the underlayer diffusing upward will minimize the impact of low light levels at the bottom of the overlying layer. In addition, there are other potential methods for controlling lateral acid diffusion including, but not limited to: the use of a basic or other additives in both the underlayer and the overlying layer, as well as the use of photodecomposable bases in the overlying layer, optimization of the bake temperatue, time, ramp temperature rate, etc.

The present invention thus provides a new imaging technology that is based on vertical acid transport. The surprising level of image fidelity (higher resolution imaging) observed when employing the methods of the present invention suggest that the present invention may be useable as a replacement for conventional lithographic imaging in some applications.

The following examples are provided to illustrate the method of the present invention and to illustrate some advantages that can be obtained using the same.

EXAMPLE 1

An underlayer composition of the present invention was prepared by mixing 72.8 mg of bis-t-butylphenyl iodonium ditrifluoromethanesulfonyl imide with 10 gm of AR 19 antireflection coating (Shipley Co.). This composition was spin coated onto a silicon substrate 200 mm in diameter and baked on a hot plate at 180° C. for 90 seconds. The resulting film thickness was 80 nm. On top of this composition was coated a prototype 157 nm photoresist based on an aromatic fluoroalcohol as described in Wallraff, et al. in Proc. SPIE 1999, 3678, 138 (the contents of which are incorporated herein by reference) with an absorbance of 3.6 microns$^{-1}$ at 157 nm. This resist was coated at a thickness of 135 nm and baked on a hot plate at 130° C. for 60 seconds.

Figure 4A:
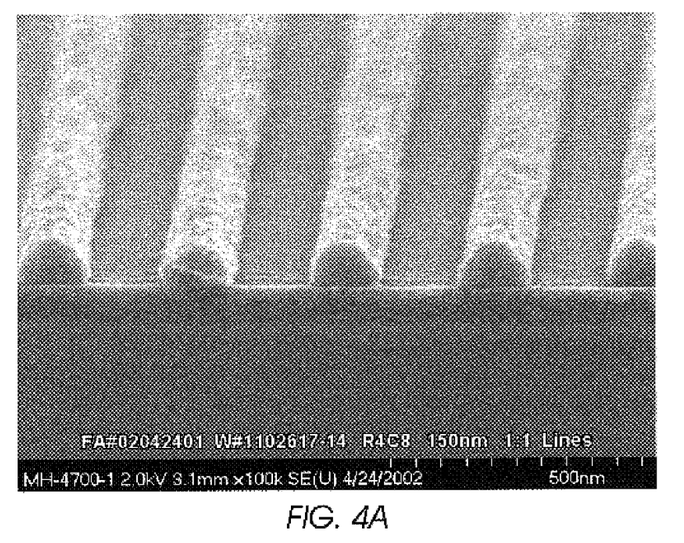

The film was exposed to $F_2$ laser radiation (157 nm) with an EXITECH stepper through a binary mask patterned with a 150 nm.line/space array at doses ranging from 5–30 mJ/cm$^2$ and baked on a hot plate at 130° C. for 30 seconds and developed in LDD-26 for 60 seconds. Clean development was observed at a dose of 21 mJ/cm$^2$ for a 150 nm l/s array (see FIG. 4A).

Comparative Example 1

An underlayer comprising AR 19 antireflection coating (Shipley Co.) without any photoacid generator was spin coated into a silicon substrate having a 200 mm diameter and baked in a hot plate at 180° C. for 3 minutes. The resulting film thickness was 80 nm. Over this composition was coated a prototype 157 nm photoresist based on an aromatic fluoroalcohol as described in Wallraff, et al. in Proc. SPIE 1999, 3678, 138 (the contents of which are incorporated herein by reference) with an absorbance of 3.6 micron$^{-1}$ at 157 nm.

This resist was coated at a thickness of 135 nm and baked on a hot plate at 130° C. for 60 seconds.

Figure 4B:
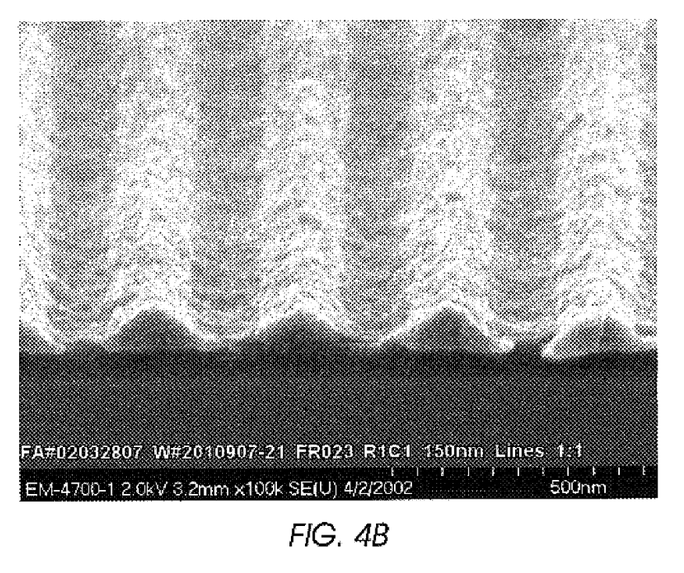

The film was exposed to F$_2$ laser radiation (157 nm) with an EXITECH stepper through a binary mask patterned with a 150 nm line/space array at doses ranging from 5–30 mJ/cm$^2$ and baked on a hot plate at 130° C. for 30 seconds and developed in CD-26 for 60 seconds. The resist did not clear under any exposure conditions and approximately ⅓ of the resist film remained at the dose to size for 150 nm line/space arrays (see FIG. 4B).

EXAMPLE 2

Another underlayer composition of the present invention was prepared by mixing 72.8 mg of iso-t-butylphenyl iodonium ditrifluoromethanesulfonyl imide with 10 gm of AR 19 antireflection coating (Shipley Co.). This composition was spin coated onto a silicon substrate having a diameter of 125 nm and baked on a hot plate at 180° C. for 3 minutes. The resulting film thickness was 80 nm. Over this composition was coated a prototype 157 nm polymer (lacking a photoacid generator) based on an aromatic fluoroalcohol as described in Wallraff, et al. in Proc. SPIE 1999, 3678, 138 (the contents of which are incorporated herein by reference) with an absorbance of 0.3 micron$^{-1}$ at 248 nm.

This polymer resist was coated at a thickness of 135 nm baked on a hot plate at 130° C. for 60 seconds. The film was exposed to KrF laser radiation (248 nm) with an Nikon stepper through a binary mask patterned with a 250 nm line/space array at doses ranging from 5–20 mJ/cm$^2$ and baked on a hot plate at 130° C. for 30 seconds and developed in CD-26 for 60 seconds. The smallest features resolved were 250 nm. Final thickness of the patterned resist film, wherein the only source of photoacid generator was from the PAG in the underlayer, was approximately 100 nm.

Comparative Example 2

An underlayer comprising AR 19 antireflection coating (Shipley Co.) without any photoacid generator was spin coated onto a silicon substrate having a diameter of 125 nm and baked on a hot plate at 180° C. for 3 minutes. The resulting film thickness was 80 nm. Over this composition was coated a prototype 157 nm resist (containing a photoacid generator) based on an aromatic fluoroalcohol as described in Wallraff, et al. in Proc. SPIE 1999, 3678, 138 (the contents of which are incorporated herein by reference) with an absorbance of 0.3 microns$^{-1}$ at 248 nm.

This polymer resist was coated at a thickness of 135 nm baked on a hot plate at 130° C. for 60 seconds. The film was exposed to KrF laser radiation (248 nm) with a Nikon stepper through a binary mask patterned with a 250 nm line/space array at doses ranging from 2.5–30 mJ/cm$^2$ and baked on a hot plate at 130° C. for 30 seconds and developed in CD-26 for 60 seconds. The smallest features resolved were 250 nm. Final thickness of the patterned resist film, wherein the only source of photoacid generator was from the PAG in the underlayer, was approximately 125 nm.

EXAMPLE 3

Figure 5:
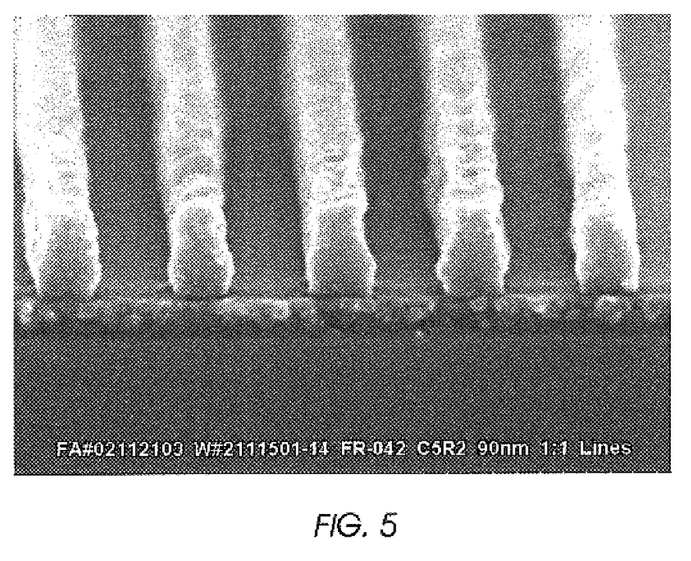
FIG. 5 is an SEM of another representative of the present invention (see Example 3).

A preferred underlayer composition of the invention was prepared by mixing 123.2 mg of triphenyl sulfonium ditrifluoromethanesulfonyl imide with 10 grams of DUV30 antireflection coating (Brewer Science). This composition was spin coated onto a silicon substrate (200 mm in diameter) and baked on a hot plate at 180° C. for 90 sec. The resulting film thickness was 80 nm. On top of this composition was coated a prototype 157 nm photoresist (containing a photoacid generator) based on an aromatic fluoroalcohol as described in Wallraff, et al. in Proc. SPIE 1999, 3678, 138, with an absorbance of 3.6/micron at 157 nm. This resist was coated at a thickness of 135 nm and baked on a hot plate at 130° C. for 60 sec. The film stack was exposed to F$_2$ laser radiation (157 nm) with a high NA EXITECH stepper through a binary mask patterned with a 90 nm line/space array at doses ranging form 5–30 mJ/cm$^2$ and baked on a hot plate at 130° C. for 30 sec. and developed in LDD-26 for 60 sec. Clean development was observed at a dose of 8.7 mJ/cm$^2$ for a 90 nm l/s array (see FIG. 5).

While the invention has been particularly shown and described with reference to preferred embodiments thereof, it will be understood by those skilled in the art that various changes in forms and details may be made herein without departing from the spirit and scope of the invention. It is therefore intended that the present invention is not limited to the exact forms and details described and illustrated, but fall within the scope of the appended claims.

What is claimed is:

1. A lithographic method comprising:
providing a bilayer film on a surface of a substrate to be patterned comprising one of a semiconductor material, a conductive material or an insulating material, wherein said bilayer film comprises an underlayer located on said surface of said substrate and an overlaying layer on a surface of said underlayer, wherein said underlayer is unpatterned and comprises (i) a photoacid generator and (ii) a polymeric material that includes at least one of an organic polymer and an inorganic matrix material, and wherein the overlying layer comprises a polymer resin that has reactive acid labile functionality and is substantially free of a photoacid generator;
simultaneously irradiating the overlaying layer and the underlayer to generate acid throughout a patterned region in the underlayer; and
transferring the pattern formed in the underlayer to said overlaying layer, said transferring comprising vertically transporting acid from the underlayer to the overlaying layer by diffusion to substantially enhance the density of acid throughout the overlaying layer, wherein sufficient acid is present in the overlaying layer to permit lithographic patterning of the overlaying layer, and the photoacid generator is selected to enhance said vertically transporting.

2. The method of claim 1 wherein the photoacid generator is selected from the group consisting of bis-t-butylphenyl iodonium ditrifluoromethanesulfonyl imide, iso-t-butylphenyl iodonium ditrifluoromethanesulfonyl imide, and triphenyl sulfonium ditrifluoromethanesulfonyl imide.

3. The method of claim 1 wherein the underlayer is irradiated with electromagnetic radiation at 157 nm.

4. The method of claim 1 wherein said vertical transporting provides a substantially continuous latent image of acid in the vertical up-diffusion region in said overlaying layer.

5. The method of claim 1 wherein said overlaying layer has a thickness ranging from about 0.1 to about 1 micron.

* * * * *